United States Patent [19]
Pinckney

[11] Patent Number: 5,843,623
[45] Date of Patent: Dec. 1, 1998

[54] LOW PROFILE SUBSTRATE GROUND PROBE

[75] Inventor: David J. Pinckney, Danbury, Conn.

[73] Assignee: International Business Machines Corporation, Armonk, N.Y.

[21] Appl. No.: 711,748

[22] Filed: Sep. 10, 1996

[51] Int. Cl.[6] ..................................................... G03C 5/00
[52] U.S. Cl. ........................ 430/296; 430/5; 250/491.1; 269/286; 269/903
[58] Field of Search ..................... 430/296, 5; 250/491.1; 269/286, 903

[56] References Cited

U.S. PATENT DOCUMENTS

| | | | |
|---|---|---|---|
| 3,834,349 | 9/1974 | Dietze et al. | 118/500 |
| 3,901,499 | 8/1975 | Sporrer | 269/156 |
| 4,189,230 | 2/1980 | Zasio | 355/76 |
| 4,323,638 | 4/1982 | Adams et al. | 430/275 |
| 4,412,133 | 10/1983 | Eckes et al. | 250/492.2 |
| 4,642,438 | 2/1987 | Beumer et al. | 219/121 L |
| 4,992,661 | 2/1991 | Tamura et al. | 250/307 |
| 5,357,116 | 10/1994 | Talbot et al. | 250/492.21 |

FOREIGN PATENT DOCUMENTS

| | | | | |
|---|---|---|---|---|
| 2-30047 A | 1/1990 | Japan | | H01J 37/305 |
| 3-57210 A | 3/1991 | Japan | | H01L 21/027 |
| 3-57211 A | 3/1991 | Japan | | H01L 21/027 |
| 03-241818 | 10/1991 | Japan | | H01L 21/027 |

*Primary Examiner*—Mark Chapman
*Attorney, Agent, or Firm*—Schmeiser, Olsen & Watts; Steve Capella

[57] ABSTRACT

According to the preferred embodiment, the invention is a simplified, low profile, adjustable substrate ground probe used in electron beam photolithography processing. The low profile substrate ground probe is compatible with state-of-the-art, electron beam lithographic processing tools that require minimal clearance. The ground contact base incorporates a flexure, an adjustable ground contact base, and an adjustment screw which allows the height of the ground contact relative to the surface of the workpiece to be accurately and easily set, without using shims. The flexure is a one-piece probe body with a flame sprayed tungsten carbide ground contact surface.

17 Claims, 3 Drawing Sheets

LOW PROFILE SUBSTRATE GROUND PROBE

BACKGROUND OF THE INVENTION

1. Technical Field

This invention generally relates to the field of semiconductor processing and manufacturing. More specifically, the present invention relates to techniques and systems for grounding semiconductor substrates during electron beam photolithography processing.

2. Background Art

Today, our society is heavily dependant on high-tech electronic devices for everyday activity. Semiconductor microchips are the components that give life to our electronic devices. Semiconductor microchips are found in virtually every home in our country, in our home appliances, in our televisions and personal computers, and in our automobiles. Additionally, our manufacturing and production facilities are becoming increasingly dependant on the use of semiconductor microchips for operational and production efficiencies. Indeed, in many ways, our everyday life could not function as it does without the use of semiconductor microchips. These semiconductor devices are manufactured in huge quantities in our country and abroad. Improvements in wafer fabrication processes have led to drastic price reductions for semiconductor devices.

The traditional semiconductor wafer fabrication process is a series of steps by which a geometric pattern or set of geometric patterns is transformed into an operating integrated circuit. An integrated circuit consists of superimposed layers of conducting, insulating, and transistor-forming materials. By arranging predetermined geometric shapes in each of these layers, an integrated circuit that performs the desired function may be constructed. The overall fabrication process consists of the patterning of a particular sequence of successive layers. Many different processes exist for creating a pattern on the silicon wafer. For general background information, one of these processes is described below.

A common step in many processes is the creation of a silicon dioxide insulating layer on the surface of a silicon wafer and the selective removal of sections of the insulating layer on the surface of a silicon wafer, thereby exposing the underlying silicon. This step begins with a bare silicon wafer. The wafer is exposed to oxygen in a high-temperature environment. The oxygen causes a uniform layer of silicon dioxide to grow on the wafer's surface. After the wafer has been cooled, it is coated with a thin film of organic resist material. The resist is thoroughly dried and baked to ensure its integrity. The wafer is now ready to begin the patterning process.

At the time of wafer fabrication, the pattern to be transferred to the wafer exists as a mask. A mask is a transparent support material coated with a thin layer of opaque material. Certain portions of the opaque material are removed, leaving opaque material on the mask in the precise pattern required on the silicon surface. Such a mask, with the desired pattern engraved upon it, is brought face down into close proximity with the wafer surface. The dark areas of opaque material on the surface of the mask are located where it is desired to leave silicon dioxide on the surface of the silicon. Openings in the mask correspond to areas where it desired to remove silicon dioxide from the silicon surface.

When the mask has been brought firmly into proximity with the wafer itself, its back surface is exposed to an intense source of ionizing radiation. The radiation is stopped in areas where the opaque mask material covers the surface of the wafer. Where there is no opaque material on the mask surface, the ionizing radiation passes through into the resist, the silicon dioxide and silicon. While the ionizing radiation has little effect on the silicon dioxide and the silicon, it breaks down the molecular structure of the resist into considerably smaller molecules.

After exposure to the ionizing radiation, in the areas exposed to radiation, the resist molecules have been broken down to much lighter molecular weight than that of the unexposed resist molecules. The solubility of organic molecules in various organic solvents is a very steep function of the molecular weight of the molecules. It is now possible to dissolve exposed resist material in solvents that will not dissolve the unexposed resist material. The resist can be developed by immersing the silicon wafer in a suitable solvent.

At this point, the pattern originally existing as a set of opaque geometries on the mask surface has been transferred as a corresponding pattern into the resist material on the surface of the silicon dioxide. The same pattern can now be transferred to the silicon dioxide itself by exposing the wafer to a material that will etch silicon dioxide but will not attack either the organic resist material or the silicon wafer surface. The etching step may be accomplished with hydrofluoric acid, which easily dissolves silicon dioxide. However, organic materials are very resistant to hydrofluoric acid, and it is incapable of etching the surface of the silicon.

The final step in patterning is removal of the remaining organic resist material. There are three basic techniques used to remove resist materials: (1) using strong organic solvents that dissolve even unexposed resist material; (2) using strong acids, such as chromic acid, that actively attack organics; (3) exposing the wafer to atomic oxygen, which will oxidize away any organic materials present on the surface of the wafer. Once the organic resist material is removed, the finished pattern on the wafer surface is a copy of the pattern that originally existed on the mask.

A similar sequence of steps is used to selectively pattern each of the successive layers of the integrated circuit. The steps differ primarily in the types of etchants used. Modern semiconductor processing typically requires the wafer to undergo many different or additional process steps such as ozone oxidation, gaseous deposition, ion implantation, metal deposition, electron beam exposure and gaseous etching. The exact procedures and materials used to process the wafer will vary depending on the specific semi-conductor product being manufactured.

One of the more widely used masking methods for the pattern transfer step of wafer processing is electron beam lithography. Electron beams are valuable lithographic tools for fabricating large scale integrated (LSI) circuits and very large scale integrated (VLSI) circuits. Electron beam lithography systems provide a fundamental method of pattern generation and are very useful for making photo lithographic masks for optical exposure, as well as direct writing on semiconductor wafers (i.e., defining patterns in resist materials with an electron beam). The electron beam lithography processing step is one which is usually more accurate than other types of photolithography.

In a typical example of electron beam photolithography, the wafer is comprised of doped silicon covered by an insulating layer. The wafer surface is coated with an electron beam resist material (i.e. photoresist). The wafer is mounted in a wafer holder or cassette and placed in an electron beam exposure system for processing. Electron beam lithography processing also typically employs conductive photo masks which are covered with photo resistive materials. One common electron beam lithography process involves the use of chrome-coated quartz or glass photo masks. The coating can be either reflective chrome or non-reflective chrome. The chrome-coated glass photo masks may be layered with chromium oxide and insulating photo resist material.

During pattern exposure via electron beam lithography, the conductive metal surfaces of the photo masks, which are located below the insulating photo resist material, must be reliably grounded in order to prevent electrical charge buildup which occurs during processing. This is typically accomplished by using a substrate ground probe which penetrates the non-conductive photo resist material and contacts the conductive surface of the photo mask. The workpiece is typically moved horizontally into the appropriate position, and is then lifted slightly in the vertical direction. During this horizontal and/or vertical movement of the workpiece, stationary ground probes contact the surface of the workpiece and penetrate the photoresist material and contact the conductive surface of the photo mask. Substrate ground probes traditionally used for this purpose protrude a substantial distance above the surface of the workpiece, are relatively expensive to manufacture, and are somewhat difficult to adjust for use with different tools in the various process steps.

Referring now to FIG. 1, an existing substrate ground probe 100 is used in conjunction with a workpiece 130. Ground probe 100 comprises a hook-like barb 110 with a conical point 112 that is fastened to a cassette body 140 using a fastener 150, such as a screw and washer. Typically, hook-like barb 110 is comprised of a Tungsten-Rhenium alloy (W-25RE). Workpiece 130 includes a photomask (or mask) 120 covered with a thin layer of photoresist 160. Workpiece 130 is moved horizontally into position beneath hook-like barb 110. During this horizontal movement, (i.e., into the page in FIG. 1) workpiece 130 engages conical point 112 of hook-like barb 110 and conical point 112 of hook-like barb 110 scrapes thin layer of photoresist 160 from the surface of workpiece 130. Additionally, when workpiece 130 is lifted vertically into position for processing, conical point 112 of hook-like barb 110 further scrapes and penetrates thin layer of photoresist 160 of workpiece 130, eventually contacting the conductive surface of the mask 120.

While substrate ground probe 100 proved acceptable for certain types of early electron beam photolithographic processing, the technology, processes, and materials used for electron beam photolithography evolved and became more sophisticated. Particularly, when the glass photo mask is coated with anti-reflective chrome, an oxide layer is formed and substrate ground probe 100 becomes less effective. Hook-like barb 110 cannot reliably penetrate the photoresist and the chromium oxide to make adequate contact with the conductive coating of the mask 120. Many newer processing environments now utilize the anti-reflective chrome coating for photomasks, severely limiting the viability of ground probe 100.

Another problem with substrate ground probe 100 is the nature of the electrical contact or connection made with the conductive surface of mask 120. Conical point 112 of hook-like barb 110 provided a very small contact surface and, therefore, establishing a stable ground connection with workpiece 120 was difficult.

In addition, the horizontal scraping of the surface of workpiece 130 would often lead to contamination of the surface of workpiece 130. Further, conical point 112 of hook-like barb 110 is quickly dulled and blunted by the combination of the horizontal and vertical scraping action in a high-volume production environment. Hook-like barb 110 would rapidly loses its ability to adequately penetrate the resist material, necessitating frequent replacement.

Referring now to FIG. 2, another existing substrate ground probe 200 is shown. Substrate ground probe 200 has a two piece probe body, comprising a ceramic stud 220 and an aluminum flexure 230. Substrate ground probe 200 provides an improvement over the previous substrate ground probes for several reasons.

First of all, ceramic stud 220 is configured with a angled face and presents a knife-edge, line-shaped, contact surface instead of a single point contact surface. The line contact surface of ceramic stud 220 allows a greater amount of surface area between substrate ground probe 200 and the workpiece 130 to be in contact. Further, a certain limited number of ceramic materials are excellent conductors and are little affected by the wear and tear associated with the scraping of the photo resistive material from the substrate. This allows for a longer duty life in a typical high-volume production environment.

In addition, substrate ground probe 200 does not rely upon the horizontal movement of workpiece 130 to establish the grounding connection. Instead, substrate ground probe 200 is mounted above workpiece 130 and is designed to engage workpiece 130 only when it is elevated vertically and locked into position for processing. The angle of the contact surface of the face of ceramic stud 220 relative to workpiece 130 allows ceramic stud 220 to scrape only a small portion of photoresistive material 160 from the surface of workpiece 130 while still providing a reliable contact to mask 120. This substantially decreases the likelihood of contaminating workpiece 130.

However, substrate ground probe 200 also has several shortcomings. Significantly, substrate ground probe 200 requires approximately 0.12 inches (3.05 mm) of clearance above the surface of workpiece 130 when utilized in a typical electron beam lithography processing environment. While this is acceptable for many semiconductor manufacturing environments, state-of-the-art electron beam lithographic processing tools such as IBM's EL-4 and ETEC's EXCALIBUR demand minimal clearance above the exposed surface of the workpiece during processing, requiring a unique solution to the grounding problem.

Further, the compound miter face of ceramic stud 220, coupled with tight manufacturing tolerances, necessitates a relatively complex manufacturing process. In addition, ceramic stud 220 is a separate piece, and must be press-fit into aluminum flexure 230. These factors increases costs and make substrate ground probe 220 a less than optimal solution. Finally, the very nature of a two-piece probe is less desirable than a one-piece probe due to manufacturing overhead, assembly considerations, and material costs.

Other previous grounding solutions often required manual removal of the photo resist from the surface of the workpiece in order for the substrate ground probe to reliably contact the conductive photo mask. This additional process step reduced productivity and increased the likelihood of contaminating the surface of the workpiece, or damaging the workpiece, thereby reducing yield and negatively affecting production margins.

Also, since different electron beam photolithography tools require the exposure plane of the substrate to be at varying heights, it is common practice to utilize shimming material to adjust the height of the probe relative to the surface of the workpiece. The substrate height requirements vary from tool to tool. The substrate height requirement for a particular tool is satisfied by placing shims, if required, between the portion of flexure 230 underlying screw 150 and cassette body 140. The insertion of shims and manual calibration of the clearance of the ground probe is both inexact and time consuming. This can be a trial and error process with repeated measuring and adjusting required in order to accurately set the substrate height as required.

Accordingly, what is needed is a substrate grounding probe that can quickly and consistently penetrate the non-conductive surface of a workpiece to establish a reliable ground connection with the conductive surface of the photomask. This grounding probe must also be compatible with the state-of-the-art low profile electron beam photolithography processing equipment currently being developed for the high-volume production semiconductor processing environment.

In addition, this grounding probe must be capable of production environment processing efficiency and must be able to be integrated into the current electron beam photolithography processing environment in a cost-effective manner with minimal disruption to the processing environment. It is also desirable to provide a substrate ground probe that can be easily and accurately adjusted to accommodate the various clearance requirements of different electron beam photolithography tools found in the present manufacturing environment. Finally, the substrate ground probe should be durable, inexpensive, relatively simple to manufacture, and easy to install.

DISCLOSURE OF INVENTION

According to the present invention, a low profile substrate grounding probe is provided. The low profile substrate grounding probe of the present invention overcomes the limitations of the prior art. The low profile substrate grounding probe includes a one piece conductive probe body with a ceramic contact surface. The probe body forms an integral flexure and ground probe combination. The ceramic contact point is created by flame spraying tungsten-carbide over the contact portion of the probe body.

The process of flame spraying a coating on a contact point is much simpler and more efficient than the current practice of manufacturing and assembling two-piece ground probes. This design allows for a simplified fabrication process which in turn greatly reduces manufacturing costs. In addition, the substrate ground of the present invention incorporates an adjustment screw which enables simple and accurate adjustments of the probe height with respect to the surface of the workpiece. This allows the ground probe to be utilized with a wide variety of electron beam processing tools without the tedious and time-consuming use of shims.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

A low profile substrate ground probe features an adjustable ground contact base, an adjustment screw, and a one piece conductive probe body with a ceramic coated contact surface. The probe body forms an integral flexure and scraping surface combination. The ceramic scraping surface contact point is created by flame spraying tungsten-carbide over the base metal contact shape. Flame-spraying is a well-known coating process commonly used to coat the surfaces of gas turbine blades and other mechanical objects that require a durable, wear-resistant coating.

The thermal spray coating process uses fine powders of metals, ceramics, or cements that are heated close to their melting points and projects them at extremely high velocities against the surface to be coated. Particle velocities frequently exceed 3,000 ft/sec (900 m/s). The resulting coatings have a characteristic thermal spray lamellar microstructure, but with a density that is very close to theoretical. Typical coating thicknesses range from about 0.002 to 0.020 inches (0.05 mm to 0.5 mm) with the preferred coating thickness for the surface of the contact point being 0.0010 inches to 0.0015 inches (0.0254 mm to 0.0381 mm). A tungsten carbide coating deposited on the body of the substrate probe by flame spraying exhibits several favorable characteristics that are well suited to application in the environment of the present invention.

These favorable characteristics include: greater internal strength; higher bond strength to substrate; improved crack resistance; improved surface finish; and enhanced wearability. The unique construction of the low profile substrate ground probe allows for simple and inexpensive manufacture. In addition, the low profile of the ground probe assembly allows for limited clearance above the surface of the workpiece, making the low profile substrate ground probe especially adaptable for use with state-of-the-art electron beam photo lithography processing tools.

Figure 1:
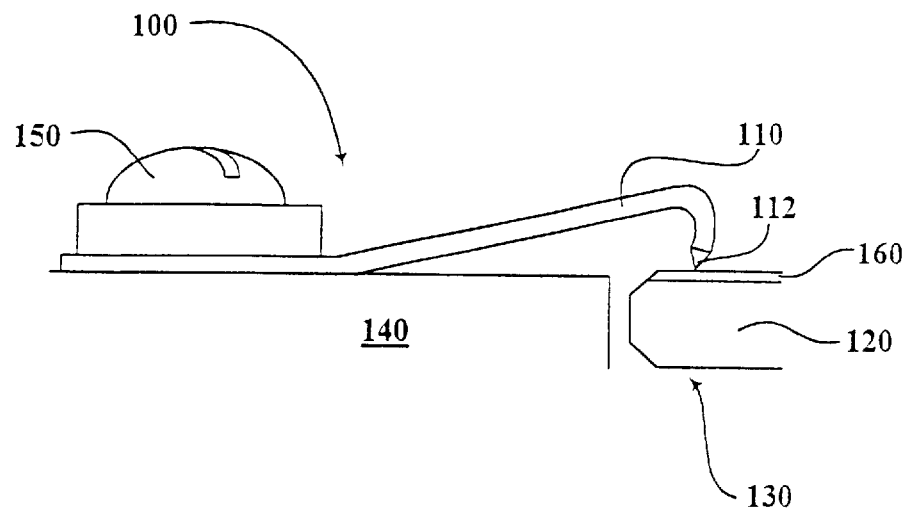
FIG. 1 is a side view of an existing substrate ground probe.
Figure 2:
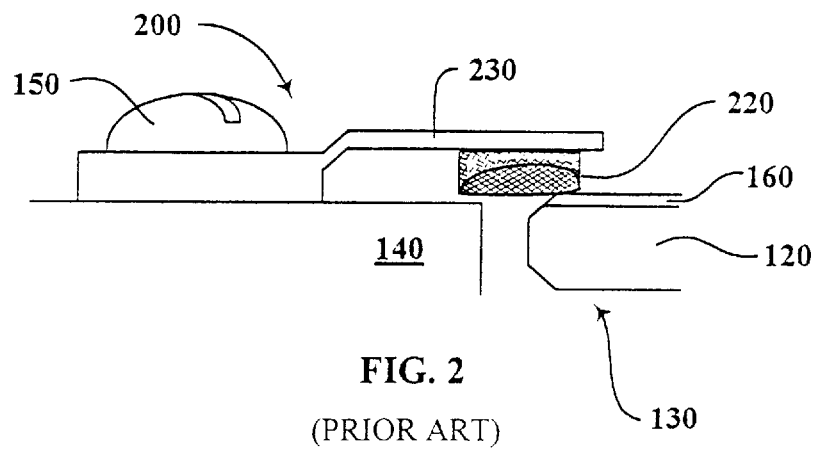
FIG. 2 is a side view of an alternative existing substrate ground probe.
Figure 3:
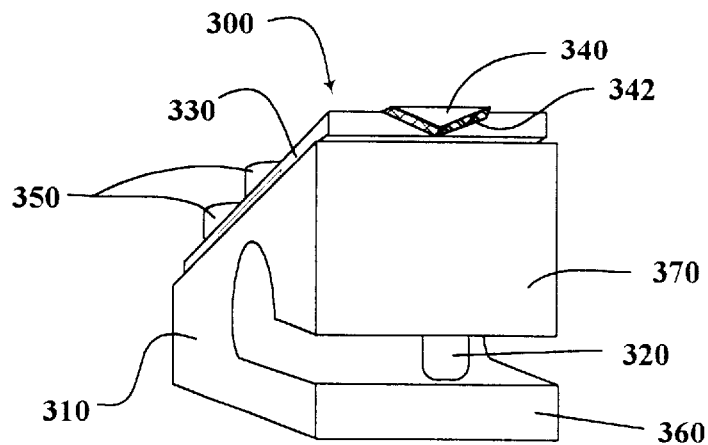
FIG. 3 is a perspective view of a low profile substrate grounding probe according to the preferred embodiment.

Referring now to FIG. 3, a low profile substrate ground probe 300 in accordance with a preferred embodiment comprises: an adjustable ground contact base 310; an adjustment screw 320; a flexure 330 with a triangular tip 340 that has a coated contact surface 342; and at least one mounting screw 350. Adjustable ground contact base 310 is mounted to a standard mask carrier (not shown) by a vacuum-compatible epoxy. Flexure 330 is connected to adjustable ground contact base 310 by appropriate attachment screws 350. In addition, the body of ground contact base 310 is constructed so that the center portion of the body is cut away, forming an elongated sideways U-shaped body with opposing arms, a lower arm 360 and an upper arm 370.

Lower arm 360 of the body of ground contact base 310 is attached to the mask carrier (not shown). A vertical hole extends through the upper arm of ground contact base 310 and adjustment screw 320 is threaded through the hole, contacting the lower arm of ground contact base 310. Adjustment screw 320 can be turned clockwise to force arms 360 and 370 apart or counterclockwise to allow them to move closer together. This design allows for a limited range of motion in the vertical direction which provides for adjusting the clearance between the coated contact surface 342 and the workpiece.

Flexure 330 is a single machined piece of conductive material with a triangular tip 340 that has a coated contact surface 342 formed at one end. In the preferred embodiment, the body of flexure 330 is constructed so as to be thinner in the middle than at the ends. This is to provide a resilient spring-like action for engaging the surface of the workpiece when the workpiece is lifted into position against coated contact surface 340. However, other suitable configurations for flexure 330 are also within the scope of the present invention.

While a titanium alloy (6Al-4V) is presented as one example of a preferred material for constructing flexure 330, any other resilient, flexible, formable, conductive material with a very low magnetic permeability may be used. One example of an alternative material for constructing flexure 330 would be BeCu (Beryllium Copper). The materials used in the present invention are limited only by the practical limits of residual magnetism. All component parts of the substrate ground probe must be able to be exposed to a low-level magnetic environment (50–100 gauss) without becoming excessively charged (i.e., a reading less than 2 milligauss on a Bell 640 Gaussmeter Plus Probe when calibrated to the 0.1 gauss range).

Tip 340 is generally triangular in shape and is an integral part of flexure 330. In the preferred embodiment, it is not attached as a separate piece. While coated contact surface 340 is generally triangular in shape, other shapes which allow for adequate grounding may also be used. The triangular shape has been chosen for illustration purposes because the edge of the triangle provides a knife-edge contact surface which is very effective in penetrating the surficial photo resist materials and the chromium oxide, thereby contacting the chrome-coated photo mask.

Tip 340 is provided with a coated contact surface 342 by flame spraying tip 340 with tungsten carbide to provide a durable, wear-resistant ceramic coating. While a preferred embodiment includes a flame-sprayed tungsten carbide contact surface, other materials and processes are contemplated which can accomplish the same purpose. For example, diamond film coatings applied through a vapor process and other deposition-type processes could be utilized. Any coating process which produces a conductive, durable, relatively abrasive contact surface that can easily penetrate the non-conductive outer surface and reliably contact the photomask would be acceptable.

Figure 4:
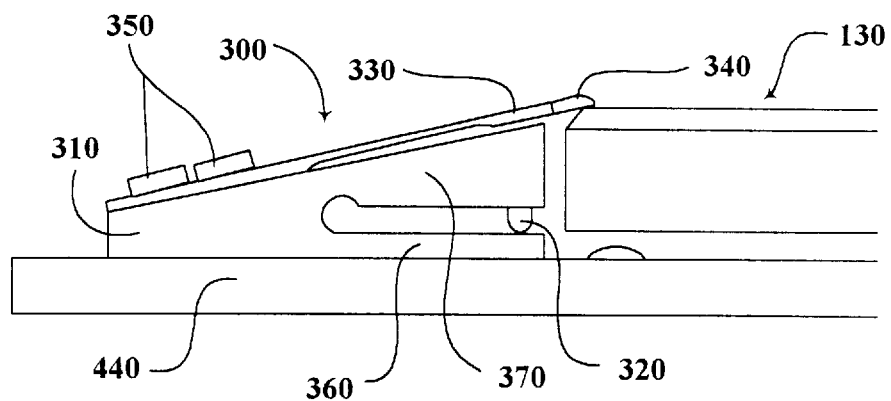
FIG. 4 is a side view of the low profile substrate ground probe according to the preferred embodiment.

Referring now to FIG. 4, a low profile substrate ground probe 300 in a typical processing environment comprises: a workpiece 130, an adjustable ground contact base 310 with upper arm 370 and lower arm 360; an adjustment screw 320; a flexure 330 with a triangular tip 340; and mounting screws 350. Adjustable ground contact base 310 is mounted to a standard mask carrier 440 by attachment screws 350. Workpiece 130 is locked into position and lifted up vertically to contact triangular tip 340. The upward movement of workpiece 130 causes flexure 330 to deflect slightly upward. The middle portion of flexure 330 is thinner than the ends so as to provide a spring-like action without an overwhelming contact resistance.

Figure 5:
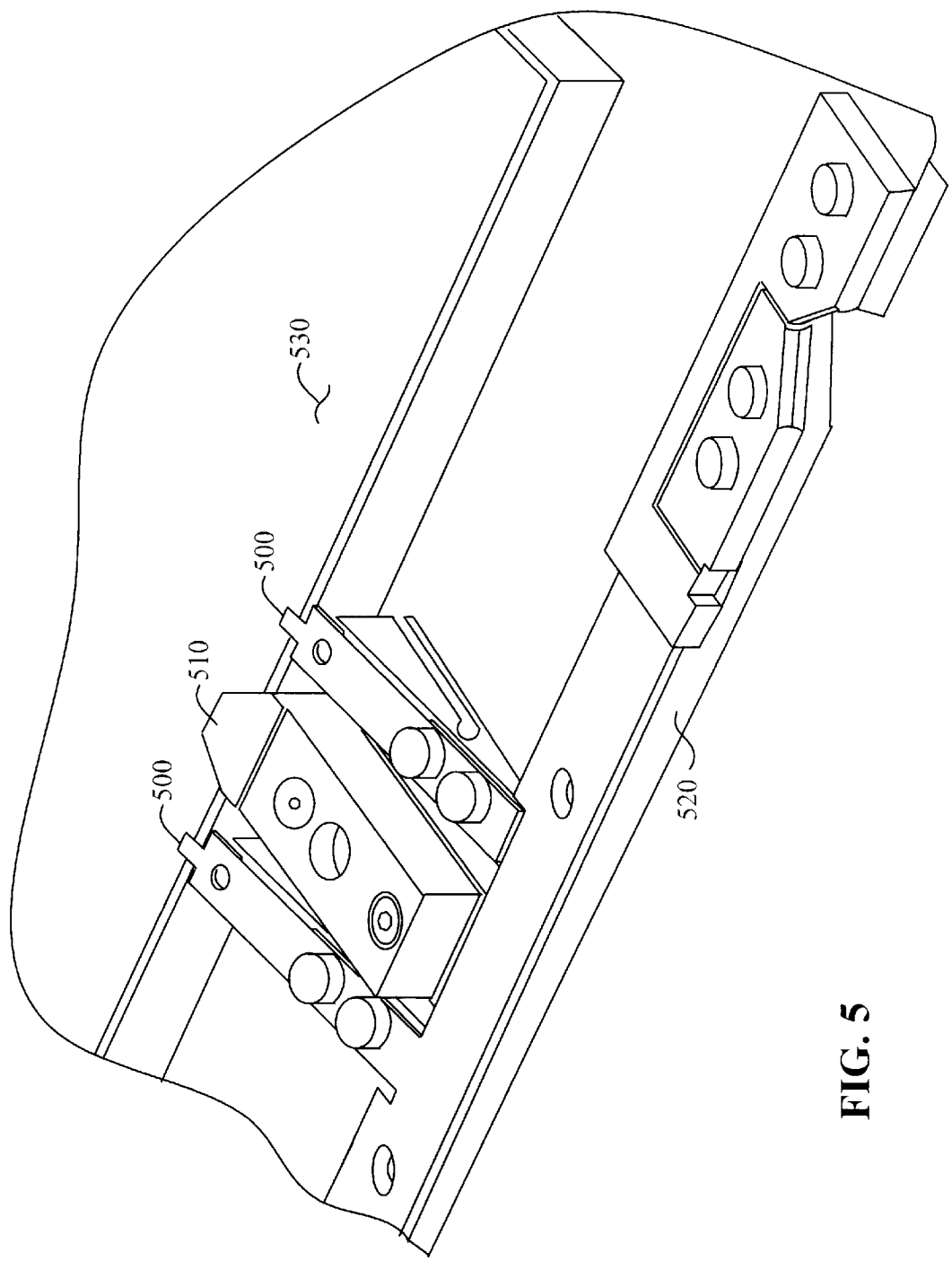
FIG. 5 is a perspective view showing the low profile ground probe in conjunction with a typical mask carrier assembly.

Referring now to FIG. 5, a typical assembly for utilizing the present invention is a typical electron beam photolithography processing environment comprises: two low profile substrate ground probes 500; a mask clamp assembly 510; a mask carrier 520; and a workpiece 530. Low profile ground probes 500 and mask clamp assembly 510 are all mounted to mask carrier 520. Mask carrier 520 may be used to safely transport workpiece 530 from processing point to processing point. Mask clamp assembly 510 holds workpiece 530 securely in place during processing. Low profile substrate ground probes 500 penetrate the surface of workpiece 530 and provide a grounding contact with the conductive surface of the photomask.

While the invention has been particularly show and described with reference to preferred embodiments thereof, it will be understood by those skilled in the art that the foregoing and other changes in form and details may be made therein without departing from the spirit and scope of the invention.

I claim:

1. A substrate ground probe comprising:
   (a) an adjustable ground contact base; and
   (b) a one-piece flexure with a first end and a second end, the first end being attached to the adjustable ground contact base and the second end having a contact surface formed thereon, the contact surface having a flame sprayed tungsten carbide coating that provides an abrasive, durable conductive contact for the ground probe.

2. The substrate ground probe of claim 1, wherein the one-piece flexure comprises a titanium alloy.

3. The substrate ground probe of claim 1, wherein the contact surface is generally triangular in shape.

4. The substrate ground probe of claim 1, wherein the adjustable ground contact base is formed with a cut out portion such that a substantially U-shaped body is formed, the body having an upper arm and a lower arm.

5. A substrate ground probe comprising:
   (a) an adjustable ground contact;
   (b) a one-piece flexure with a first end and a second end, the first end being attached to the adjustable ground contact base and the second end having a contact surface formed thereon, the contact surface having a flame sprayed tungsten carbide coating that provides a durable, conductive contact for the ground probe; and
   (c) an adjustment mechanism for adjusting the height of the contact surface relative to the ground contact base.

6. The substrate ground probe of claim 5, wherein the one-piece flexure comprises a titanium alloy.

7. The substrate ground probe of claim 5, wherein the contact surface is generally triangular in shape.

8. The substrate ground probe of claim 5, wherein the adjustable ground contact base is formed with a cut out portion such that a substantially U-shaped body is formed, the body having an upper arm and a lower arm.

9. The substrate ground probe of claim 8, wherein the upper arm has a threaded aperture formed therein, and wherein the adjustment mechanism further comprises:
   a threaded adjustment screw for adjusting the height of the contact surface relative to the ground contact base, the threaded adjustment screw having a first end, the threaded adjustment screw being threaded through the threaded aperture formed in the upper arm of the ground contact base and disposed so that the first end of the adjustment screw contacts the lower arm of the adjustable ground contact base and such that turning the adjustment screw in one direction causes the distance between the upper arm and the lower arm to increase.

10. The substrate ground probe of claim 9 wherein turning the adjustment screw in the opposite direction causes the distance between the upper arm and the lower arm to decrease.

11. A substrate ground probe comprising:

(a) an adjustable ground contact base, the adjustable ground contact base being formed with a cut out portion such that a substantially U-shaped body is formed, the body having an upper arm and a lower arm, the upper arm having a threaded aperture formed therein;

(b) a one-piece titanium alloy flexure with a first end and a second end, the first end of the flexure being attached to the upper arm of the adjustable ground contact base and the second end of the flexure having a generally triangular contact surface formed thereon, the flexure having a middle portion which is thinner than the first end and the second end, the contact surface having a flame sprayed tungsten carbide coating; and (c) a threaded adjustment screw for adjusting the height of the contact surface relative to the lower arm of the ground contact base, the threaded adjustment screw having a first end, the threaded adjustment screw being threaded through the threaded aperture so that the first end of the adjustment screw contacts the lower arm of the adjustable ground contact base and such that turning the adjustment screw in one direction causes the distance between the upper arm and the lower arm to increase.

12. The substrate ground probe of claim 11 wherein turning the adjustment screw in the opposite direction causes the distance between the upper arm and the lower arm to decrease.

13. A method of grounding a substrate for electron beam photolithography, the method comprising the steps of:

(a) providing a substrate ground probe, the ground probe comprising:

an adjustable ground contact base, the adjustable ground contact base being formed with a cut out portion such that a substantially U-shaped body is formed, the body having an upper arm and a lower arm, the upper arm having a threaded aperture formed therein;

a one-piece titanium alloy flexure with a first end and a second end, the first end of the flexure being attached to the upper arm of the adjustable ground contact base and the second end of the flexure having a generally triangular contact surface formed thereon, the flexure having a middle portion which is thinner than the first end and the second end, the contact surface having a flame sprayed tungsten carbide coating; and, a threaded adjustment screw for adjusting the height of the contact surface relative to the ground contact base, the threaded adjustment screw having a first end, the threaded adjustment screw being threaded through the threaded aperture so that the first end of the adjustment screw contacts the lower arm of the adjustable ground contact base; and (b) placing a substrate in contact with the contact surface.

14. The method of claim 13, further comprising the step of turning the adjustment screw in a certain direction, thereby causing the distance between the upper arm and the lower arm to increase.

15. The method of claim 13, further comprising the step of turning the adjustment screw in a certain direction, thereby causing the distance between the upper arm and the lower arm to decrease.

16. The method of claim 13 wherein the step of placing the substrate in contact with the contact surface includes the steps of:

moving the substrate horizontally into position under the contact surface without contacting the contact surface; and, vertically raising the substrate to bring the substrate into contact with the contact surface.

17. The method of claim 16 wherein the vertical raising of the substrate causes the contact surface to scrape through a layer of photoresist on the substrate and to contact a conductive surface of the substrate.

* * * * *